Feb. 8, 1966 R. V. ANDES ETAL 3,234,044

USE OF AN ELECTRON BEAM FOR MANUFACTURING CONDUCTIVE PATTERNS

Filed Sept. 25, 1962

INVENTORS
RALPH V. ANDES
ERWIN G. WEBER
BY Herbert F. Somermeyer
ATTORNEY 3,234,044

USE OF AN ELECTRON BEAM FOR MANUFACTURING CONDUCTIVE PATTERNS

Ralph V. Andes, Stillwater, and Erwin G. Weber, Hopkins, Minn., assignors to Sperry Rand Corporation, New York, N.Y., a corporation of Delaware Filed Sept. 25, 1962, Ser. No. 226,120
9 Claims. (Cl. 117—212)

This invention relates generally to printed circuit cards and more specifically to a method for fabricating the electrically conductive pattern of the cards by using an electron beam as an energy source.

In the recent past, printed circuit cards, which may be said to generally consist of an electrically conductive material disposed in accordance with a predetermined pattern on an electrically insulating base material, have found increasing application in the electronics industry. Recent trends in the industry toward product and component miniaturization have been reflected in many printed circuit manufacturing specifications wherein formerly acceptable tolerances have been considerably reduced. The design of certain types of printed circuits, for example, those employed in conjunction with thin film memory devices, requires that the conductors have very narrow and substantially uniform widths. Printed circuit fabrication methods hitherto available have not been able to provide narrow conductors having the desired degree of uniformity in conductor width and edge definition.

An examination of the prior art reveals several methods for producing printed circuits. In one typical method a sheet of electrically conductive copper foil or the like is bonded onto an electrically insulating base material, and after coating those portions of the foil where a conductor is desired with an etchant resist, the uncoated foil portions are removed by etching. In another typical method, the desired conductive pattern is formed by vacuum depositing the conductive material on the insulating base. A masking device, similar in function to a stencil, is used to define the desired circuit pattern, and permits the deposition of the conductive material on predetermined portions of the base material. The thickness of the deposited conductors is often increased by electrodeposition techniques.

The aforementioned methods for fabricating printed circuit cards have been found objectionable in that they fail to economically produce reliable printed circuit conductors exhibiting a uniform and small width. Oftentime the requirements of more advanced circuit design are such that the maximum permissible conductor width is exceeded by the expected error inherent in the presently practiced processes. An additional problem relating to printed circuit fabrication techniques, as they are presently known, involves the inability to apply these techniques to reclaim circuit cards which have been rejected because of poor conductor definition resulting, for example, from pin holes, edge notches, or discontinuities in the conductors. Where the conductors on a printed circuit card are positioned relatively close together, well known printed circuit production processes are incapable of being economically employed for repairing a defective conductor in order to reclaim the cards.

According to the present invention, there is provided a process for fabricating the conductive pattern of a printed circuit card which includes applying a metallic coating to the surface of an electrically insulating material and exposing predetermined portions of the coating to the action of a concentrated beam of electrons. "Metallic" for the purpose of the present invention is meant to include free metals or compounds thereof capable of being reduced to a free metal by heat generated by an electron beam. The electron beam is used as a heat source for causing the metal exposed thereto to fuse or melt and remain fused or molten only momentarily, the fused metal upon cooling and resolidfying becoming mechanically and possibly chemically attached or bonded to the base material. Those portions of the coating not exposed to the beam and accordingly not permanently bonded to the base material are thereafter removed.

The aforementioned process for forming a conductive pattern also permits, in a single operation, the forming of a continuous conductor or superimposed conductor pair which may extend along opposite sides of the insulating film or base. The fabrication of such a conductor may be accomplished, for example, by rotating the metallically coated insulating material while certain portions of the coating are selectively exposed to the electron beam.

The method of this invention may also be employed to repair defective conductor strips, that is strips having pin holes, edge notches, discontinuities, or the like, on a printed circuit card and finds particular application in reclaiming defective printed circuit cards wherein the conductive pattern includes closely spaced conductors of limited width. Repair may be accomplished by disposing a metallic coating in the area of the defect and exposing the repair area to the electron beam. The metallic coating and very small portions of the conductor being repaired are thereby melted and upon resolidifying become integrally associated to overcome the deficiency.

It is, therefore, the primary object of this invention to provide an improved method for fabricating printed circuit cards.

It is also an object of this invention to provide a method for fabricating printed circuit cards wherein the conductive portions of the card may be formed on opposite sides thereof as integral, continuous strips.

It is a further object of this invention to provide a method for fabricating printed circuit conductors having a uniform and very small width.

It is yet another object of this invention to provide a method for reclaiming a printed circuit card unacceptable because of deficiencies in the conductor portion of the card.

It is still another object of the present invention to provide a method for fabricating the conductor pattern of a printed circuit card wherein a beam of electrons is used to form the conductors.

These and other more detailed and specific objects will be disclosed in the course of the following specification, reference being had to the accompanying drawings, in which.

Figure 1:
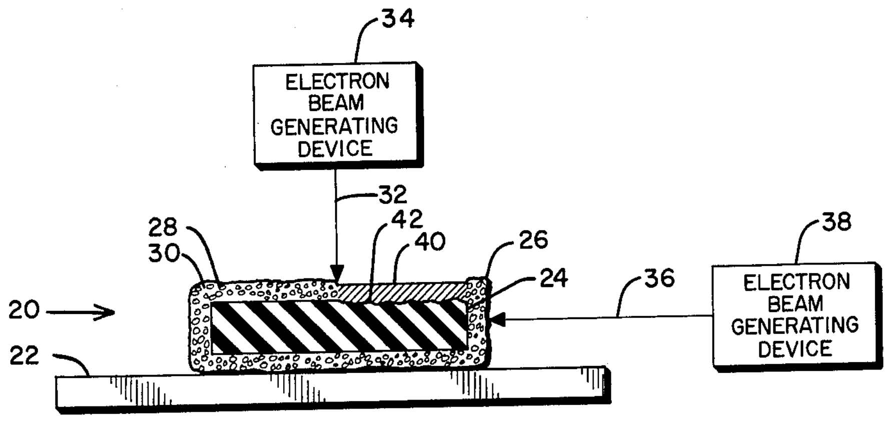
FIG. 1 is a cross-sectional view illustrating an arrangement for fabricating a printed circuit card according to the method of this invention.

Referring now to FIG. 1, there is seen a workpiece 20 retained on a worktable or support means 22. The workpiece 20 includes an insulating base material 24 having a metallic layer or coating 26 consisting of metallic particles 28 secured to the base material by a medium or vehicle 30, such as a resinous solution, in which the metallic particles had been dispersed prior to being applied to the base material. The base material is preferably fabricated from an insulating plastic material, such as, for example, polystyrene, polyethylene terephthalate, or epoxy-glass laminates. In a preferred embodiment, the insulating material 24 is a thin sheet or film of polyethylene terephthalate having a thickness of approximately 0.05 inch, but limitation to this material or these dimensions is not intended.

The metallic particles employed are in a finely divided form preferably having a diameter of approximately 0.00004 inch or less and may be a free metal or reducible compounds thereof, such as an oxide, for example, zinc or copper oxide. In the preferred embodiment the metallic particles 28 are copper oxide. The finely divided particles of copper oxide are of a relatively high degree of purity, preferably reagent grade, although grades of lesser purity may also be employed.

The vehicle 30 acts as a temporary bonding agent for maintaining the metallic particles adjacent to one another and for retaining the particles in contact with the base material. One vehicle found to be satisfactory consists of the sodium salt of carboxy methyl cellulose dissolved in ethyl alcohol, although it has been found that a wide range of adhesive-type vehicles may be suitably employed. The proportion by weight of the aforementioned resin to the solvent varies from 1% to 20% depending upon the grade of the resin and also upon the intended method of application. In preparing a mixture suitable for spraying under pressure, the vehicle and copper oxide particles are made up into a slurry having a suitable consistency, for example, the ratio by weight of the copper oxide to the vehicle could be approximately one to one. Alternatively the metallic coating may be applied to the base material by brushing or dipping. After depositing the slurry on the base material in an amount sufficient to form a layer having a thicknes of about 0.001 inch, the solvent is permitted to evaporate, and the remaining resin serves as an adhering agent. The described vehicle is compatible with a polyethylene terephthalate base material; however, when other organic vehicles or base materials are used, care should be taken to make sure that the materials chosen are compatible with one another and that no damage, such as undue softening, swelling, or other adverse reaction occur with the base material.

Alternative methods may be employed for applying a metallic coating or layer to the insulating base material. For example, finely divided metallic particles may be distributed over a major surface of the insulating material without the use of a vehicle. One method for preparing such a metallic layer exhibiting a substantially uniform thickness on the order of 0.001 inch would include distributing, for example, by sifting, a superfluous amount of copper or copper oxide particles on the selected base material. The resulting arrangement may then be drawn beneath a knife coater, the knife being appropriately spaced from its associated table for wiping off copper oxide particles in excess of the amount necessary for forming a metallic layer having the desired thickness. Still another method of providing a metallic layer is to dispose a metallic foil material on the surface of the base material. If desired, the foil may be maintained in place on the base material by gravitational forces only or by attaching means, for example an adhesive agent, which could be employed as a temporary securing agent for securing the foil to the base material to facilitate handling. Other methods of disposing a layer of conductive material on an insulating base material may include chemical or vacuum deposition and electro-disposition processes. Conventionally these last mentioned methods, although suitable for laying down a metallic layer, have been found unsatisfactory in many printed circuit applications because the bond strength established between the base material and the metallic layer is relatively poor. As will be seen hereinafter, this problem is obviated by the method of the present invention wherein a good bond between the conductor and the base material is established during the forming of the conductor.

The worktable or support means 22 is rectilinearly movable in a plane substantially perpendicular to the longitudinal axis of an electron beam 32 which is generated by an electron generating device 34 and impinges on a major surface of the workpiece 20. The table is also movable in a plane perpendicular to the longitudinal axis of an electron beam 36 which is generated by an electron generating device 38 and impinges on the metallized edge of the workpiece. The preferred path of the electrons constituting the beam used in this embodiment of the invention is substantially normal to the surface of the material upon which the electrons impinge, although it should be understood that they may be caused to impinge on the surfaces at either acute or obtuse angles. As there are many known types of worktable motion translating means, no particular description of any one such means will be included herein, it being understood that a suitable type of device will be chosen for effecting the desired movement of the workpiece. The worktable must be capable of substantially precise movement when it is desired to form closely spaced conductors exhibiting extremely small, uniform widths.

According to the present invention, the electron beams 32 and 36 are used primarily as finely defined energy generating sources. As is well known, when an electron beam is caused to impinge on a material the kinetic energy of the bombarding electrons is transferred to the material which then becomes heated. By properly controlling the intensity of the beam and the time of exposure of the material to the beam, the temperature of the material thus bombarded may be precisely elevated by a predetermined amount, for example, to the melting point temperature of the material forming the conductive area. Generally speaking, the beam of electrons employed with the present invention should have an energy level exceeding that required to fuse the metallic coating. The width of the area affected by the impingement of the electrons is determined substantially by the width of the electron beam.

In the present embodiment, the beams 32 and 36 are generated by point cathodes (not shown) and exhibit a circular cross-sectional area having an effective working diameter of approximately 0.0005 inch. Point cathodes were selected for use in the preferred embodiment of the invention for generating what may be referred to as "electron micro-beams" to permit fabrication of conductive strips exhibiting extremely small widths, It should be understood, however, the other cathodes may be employed in conjunction with a suitable focussing means for obtaining a beam having a desired diameter. The focussing means may be single lenses of the electric or magnetic type, as well as electron optical mirrors. With regard to the shape and control of the electron beam, it should be understood that a specific cross-sectional shape may be assigned thereto by using control diaphragms provided with suitably shaped apertures. Commercially available electron beam generating apparatus, such as the Hamilton-Zeiss Electron Beam Welder sold by Hamilton Electrons Inc., may be used in carrying out the method of the present invention. However, it would probably be necessary to modify the electron gun in order to get an electron beam having the desired diameter.

In operation, the metallically coated workpiece 20 is located such that when the beam is turned on, it will impinge on a predetermined area of the metallic layer 26. After the copper oxide particles at the starting point area have been fused, the worktable moves the workpiece 20 at a predetermined and substantially constant rate of speed and in a manner to cause the beam to strike preselected portions of the layer 26, these portions corresponding to the desired circuit pattern. In one arrangement the workpiece, while exposed to the beam, may be moved at about five inches per second while the beam current intensity is maintained at approximately 50 milliamperes and the accelerating voltage about one hundred thousand volts. With this arrangement the impingement of the minute, high velocity electrons on the copper oxide particles causes them to fuse and to be chemically reduced to the free metal. Additionally, the heat generated decomposes the vehicle 30, the gases resulting therefrom being immediately evacuated from the system.

As the beam moves on after melting or forming a portion of the metallic layer, the fused metal cools, and solidifies forming an integral electrically conductive strip 40 of metallic copper. The heat generated also causes at least a portion of the base material to be temporarily fused or liquified. During cooling, the melted metal and liquified base material fuse together and form a good mechanical bond therebetween as exemplified at 42. It is also believed that some chemical bonding of the base material and metal occurs.

The method of bonding resulting from the present invention obviates the use of an adhesive material as a bonding agent between the conducting and insulating layers, such as is commonly used in the more familiar printed circuit fabrication processes. As can be seen at this time, the bonding that occurs as a result of the technique of this invention permits the metallic layers to be initially deposited on the base material without particular regard to the strength or permanent nature of the bond between the layer and the material at that time.

It should be noted that the electron beam treated area exists in the molten state for a very short period of time, and that cooling of the melted area also occurs in a comparatively short period of time. Accordingly, little if any, lateral flow of the melted metal occurs. Because the beam diameter is for all practical purposes a constant, and because the beam intensity and time of exposure of an area to the beam can be closely controlled, it can be seen that the only source of error which would significantly interfere with the forming of a conductor having a uniform width would be the worktable. For this reason, when it is desired to fabricate a conductor having an extremely small width, for example, on the order of 0.0001 inch, it will be appreciated that the worktable selected must be capable of functioning with only very small error in horizontal movement. To facilitate the beam tracing of the circuit pattern in a predetermined and accurate manner, it is preferred that the motion of the table be automatically programmed, for example, by a computer or the like. It is to be understood that the desired relative motion between the electron beam and the workpiece may readily be accomplished by movement of the electron beam generating device, or by the combination of controlled motion of both the beam generating device and the workpiece.

After the conductor pattern has been formed on the upper major surface of the workpiece 20, the minor surfaces or edges may be treated with the beam 36 for forming conductors along these edges. Thus conductor portions could be formed which coincide with and attach to selected conductors formed on the major surface of the base material, such as the partially formed conductor 35. After the desired conductors have been fabricated on either or both of the two surfaces exposed to the beams 32 and 36, the workpiece 20 may be inverted to permit fabrication of conductors on its other surfaces. When it is desired to form a continuous conductor on two opposite surfaces of the base material, it is generally preferred that a rotatable worktable or support means be used.

After the desired conductor pattern has been formed, the workpiece is treated to remove the remaining vehicle and any unfused metallic particles. When the resin employed in sodium carboxy methyl cellulose, water may be used for washing away the residual vehicle. If other resins are employed, suitable solvents which do not affect the base material, must be selected for washing away undesirable vehicle. Where no vehicle is employed, the unfused metal portions may be removed by brushing with or without the aid of a detergent solution to facilitate cleaning. Where a foil was used to form the metallic layer, the unfused portion of the foil may be separated from the base material by peeling. Peeling may result in the forming of slightly ragged edges, however, where the thickness of the conductor is small compared to its width, the ragged edges do not form an appreciable or significant portion of the conductor.

Figure 2:
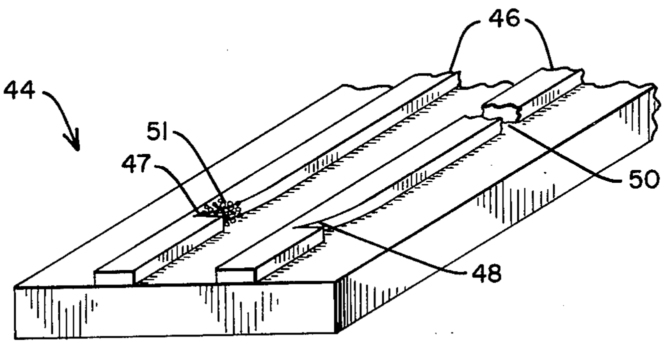
FIG. 2 is an enlarged perspective view of a portion of a printed circuit card having defective conductor strips.

Referring now to FIG. 2, in which is shown a greatly enlarged view of a printed circuit card 44 prepared by one of the aforementioned prior art methods, it can be seen that the conductors 46 exhibit deficiencies such as the edge notches 47 and 48 and the discontinuity 50. For preparing the card 44 for reclamation by the method of the present invention, finely divided copper or copper oxide particles 51 are disposed in the area of the deficiencies as at 47. Thereafter, the card 44 is appropriately disposed on a worktable for treatment with an electron beam. The metal particles 51 and a small portion of the conductor in the area of the defect are exposed to the action of a beam of electrons for causing the exposed material to fuse. Upon cooling the fused material forms an integral portion of the previously fabricated conductor, thereby correcting the previously existing deficiency.

In summary, the present invention includes initialy the application of a metallic coating to an electrically insulating base material. Thereafter an electron beam having a predetermined cross-sectional area is controllably manipulated across the metallically coated base material to trace the desired circuit pattern in the metallic coating, the portions of the coating struck by the electrons being fused thereby. Upon cooling, the fused material forms the conductors on the insulating material. Those portions of the coating not exposed to the electron beam are then removed from the base material.

It is understood that suitable modifications may be made in the structure as disclosed provided such modifications come within the spirit and scope of the appended claims. Having now, therefore, fully illustrated and described our invention, what we claim to be new and desire to protect by Letters Patent is:

1. A method for manufacturing the conductive pattern of a printed circuit card including the steps of:

(a) coating an electrically insulating base member with a layer of a metallic material;

(b) subjecting a predetermined portion of the metallic material to the action of a beam of electrons having an energy level exceeding that required to fuse the metallic material and a portion of the surface of said base member for causing the predetermined portions to melt;

(c) permitting the melted portions to freeze together;

(d) and thereafter removing any metallic material not exposed to the beam of electrons.

2. A method for fabricating the conductive pattern of a printed circuit card including the steps of:

(a) coating an electrically insulating base member with a layer of a metallic material;

(b) subjecting a predetermined portion of the layer of metallic material to the action of a beam of electrons having an energy level exceeding that required to melt the metallic material for causing the predetermined portion and at least a portion of the surface of the base member to momentarily melt;

(c) inducing relative motion between the beam of electrons and the layer of metallic material for causing the beam to trace a circuit pattern along the surface of the layer, the material exposed to the beam melting during the relative motion of the beam, and for causing the melted portions to solidify when the electron beam is no longer focused thereon;

(d) and thereafter removing from the base material any metallic material not exposed to the beam of electrons.

3. A method for fabricating the conductive pattern of a printed circuit card including the steps of:

(a) coating an electrically insulating substrate member with a layer of a metallic material;

(b) subjecting a predetermined portion of the metallic material to the action of a beam of electrons having an energy level exceeding that required to melt the metallic material and a portion of the surface of substrate member for causing the predetermined portions to momentarily melt;

(c) moving the beam with respect to the material over a predetermined area of the material and substrate surface area, which areas are momentarily melted by the action of the beam, the conductive pattern being formed upon the freezing of the melted portion and surface area;

(d) and thereafter removing from the base material any metallic material not exposed to the action of the beam of electrons.

4. A method for fabricating the conductive pattern of a printed circuit card including the steps of:

(a) disposing a layer of metallic oxide on an electrically insulating base material;

(b) subjecting a predetermined portion of the metallic oxide layer to the action of a heat source in the form of a beam of electrons having an energy level exceeding that required to fuse the metallic oxide for causing the predetermined portion to fuse and be chemically reduced to form an electrically conductive, substantially free metal bonded to said base member;

(c) and thereafter removing from the insulating base material that portion of the metallic oxide layer not chemically reduced.

5. A method as in claim 4 wherein the metallic oxide is in the form of finely divided particles.

6. A method for fabricating the conductive pattern of a printed circuit card including the steps of:

(a) disposing a metallic foil on an electrically insulating substrate member;

(b) subjecting a portion of the metal foil to the action of a heat source in the form of a beam of electrons having an energy level exceeding that required to melt the metallic foil for causing the portion to melt, and bond to the substrate member;

(c) freezing the melted portion of the metal foil;

(d) and thereafter removing any portion of the foil not subjected to the beam of electrons.

7. A method for fabricating the conductive pattern of a printed circuit card including the steps of:

(a) coating an electrically insulating substrate member with a layer of a metallic material consisting of finely divided metal particles dispersed in a vehicle;

(b) subjecting a predetermined area of the layer to the action of a heat source in the form of a beam of electrons for causing the metal particles within the area to fuse and the vehicle within the area to be decomposed;

(c) freezing the fused metal particles;

(d) and thereafter removing from the substrate member that portion of the layer not exposed to the beam of electrons.

8. A method for producing a predetermined pattern of electrically conductive strips on an insulating base material, including the steps of:

(a) coating an electrically insulating polyethylene terephthalate base material with a layer of finely divided metal oxide particles;

(b) directing an electron micro-beam having a predetermined cross-sectional area at a predetermined portion of the metal oxide layer for causing the metal oxide portion and a portion of the base material to fuse, the metal oxide particles included within the portion being thereby chemically reduced; and (c) freezing the fused portions of the metal oxide layer and the base material whereby the desired conductive strips are formed, the strips having a width substantially equal to the largest dimension of the cross-sectional area;

(d) and thereafter removing from the base material the metal oxide particles which were not chemically reduced.

9. A method for bridging an area between a pair of electrical conductors disposed on an electrically insulating base material including the steps of:

(a) applying a coating of finely divided metal particles on the base material in the area between the conductors;

(b) exposing a predetermined portion of the applied coating and the conductors adjacent thereto to the action of a heat source in the form of a beam of electrons having an energy level exceeding that required to melt the metallic coating for causing the exposed coating and conductor portions to momentarily melt;

(c) freezing the melted portions of the coating and the conductors whereupon the melted coating electrically interconnects the conductors;

(d) and thereafter removing from the base material any of the applied coating not exposed to the action of the electron beam.

References Cited by the Examiner

UNITED STATES PATENTS

| | | | |
|---|---|---|---|
| 2,893,891 | 7/1959 | Bradstreet et al. | 117—22 |
| 3,056,881 | 10/1962 | Schwarz | 117—212 |
| 3,117,022 | 1/1964 | Bronson et al. | 117—212 |

FOREIGN PATENTS 861,119 12/1952 Germany.

OTHER REFERENCES

National Bureau of Standards, Circular No. 468, U.S. Dept. of Commerce, QCU 52, pg. 28 relied on.

Selvin et al.: "Proceedings of the 2nd Symposium on Electron Beam Processes," March 24–25, 1960, Boston, pp. 70–93, p. 90 relied on.

RICHARD D. NEVIUS, *Primary Examiner.*

W. L. JARVIS, *Assistant Examiner.*